(12) United States Patent
Lee et al.

(10) Patent No.: US 12,356,766 B2
(45) Date of Patent: Jul. 8, 2025

(54) DISPLAY DEVICE USING SEMICONDUCTOR LIGHT-EMITTING ELEMENT SEATED IN PLURALITY OF CELLS OF BARRIER RIB PORTION

(71) Applicant: LG ELECTRONICS INC., Seoul (KR)

(72) Inventors: Jinhyung Lee, Seoul (KR); Changseo Park, Seoul (KR); Younho Heo, Seoul (KR); Kisu Kim, Seoul (KR); Seongmin Moon, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 474 days.

(21) Appl. No.: 17/780,880

(22) PCT Filed: Dec. 18, 2019

(86) PCT No.: PCT/KR2019/017954
§ 371 (c)(1),
(2) Date: May 27, 2022

(87) PCT Pub. No.: WO2021/117956
PCT Pub. Date: Jun. 17, 2021

(65) Prior Publication Data
US 2023/0015395 A1    Jan. 19, 2023

(30) Foreign Application Priority Data

Dec. 11, 2019  (KR) .......................... 10-2019-0164885

(51) Int. Cl.
*H10H 20/831*   (2025.01)
*H01L 25/075*   (2006.01)
(Continued)

(52) U.S. Cl.
CPC ..... *H10H 20/8312* (2025.01); *H01L 25/0753* (2013.01); *H10H 20/01* (2025.01);
(Continued)

(58) Field of Classification Search
CPC .. H10H 20/8312; H10H 20/857; H10H 20/01; H01L 25/0753
See application file for complete search history.

(56) References Cited

U.S. PATENT DOCUMENTS

2005/0009303 A1    1/2005  Schatz
2014/0261613 A1    9/2014  Nielson et al.
(Continued)

FOREIGN PATENT DOCUMENTS

KR    10-2013-0033450 A    4/2013
KR    10-2019-0098291 A    8/2019
(Continued)

*Primary Examiner* — Michael Jung
(74) *Attorney, Agent, or Firm* — Birch, Stewart, Kolasch & Birch, LLP

(57) ABSTRACT

Discussed is a display device including a base portion; a first electrode formed on the base portion; a barrier rib portion stacked on the first electrode while forming a plurality of cells; a second electrode formed on the barrier rib portion; and semiconductor light emitting diodes seated in the plurality of cells, wherein the first electrode and the second electrode are spaced apart from each other with the barrier rib portion disposed therebetween.

14 Claims, 21 Drawing Sheets

(51) Int. Cl.
  *H10H 20/01* (2025.01)
  *H10H 20/857* (2025.01)

(52) U.S. Cl.
  CPC ......... *H10H 20/857* (2025.01); *H10H 20/032* (2025.01); *H10H 20/0364* (2025.01)

(56) References Cited

U.S. PATENT DOCUMENTS

| | | |
|---|---|---|
| 2017/0133564 A1 | 5/2017 | Ulmer et al. |
| 2018/0033843 A1* | 2/2018 | Liu ........................ H10D 86/60 |
| 2018/0240937 A1* | 8/2018 | Park ....................... H05B 33/22 |
| 2019/0252576 A1* | 8/2019 | Lee ........................ H10H 20/01 |
| 2022/0013511 A1* | 1/2022 | Kishimoto ............ H01L 25/167 |

FOREIGN PATENT DOCUMENTS

| | | |
|---|---|---|
| KR | 10-2019-0122113 A | 10/2019 |
| KR | 10-2019-0122117 A | 10/2019 |
| WO | WO 2019/203404 A1 | 10/2019 |

* cited by examiner

[FIG. 1]
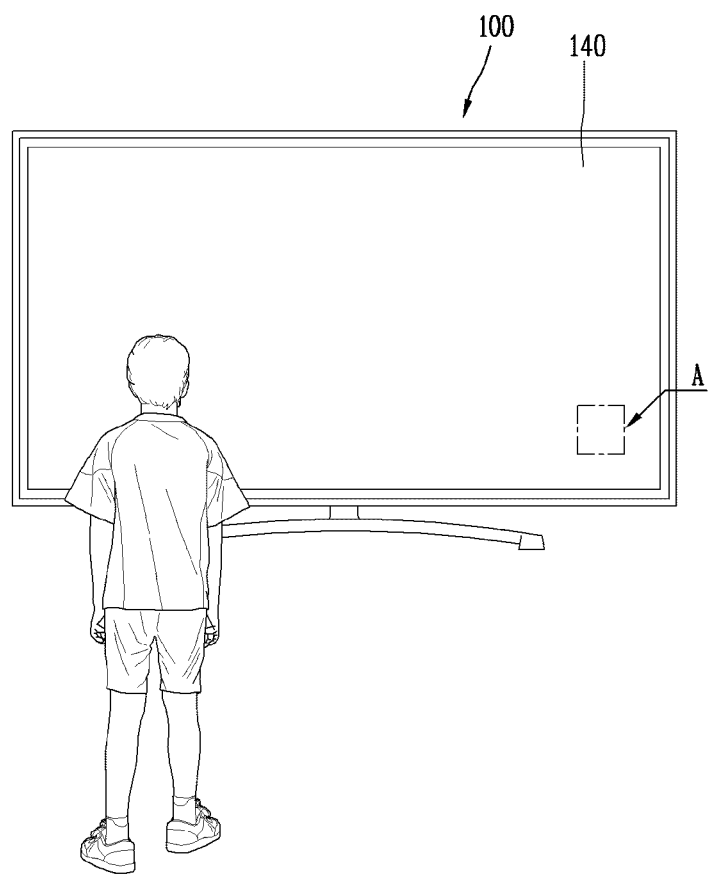

【FIG. 2】
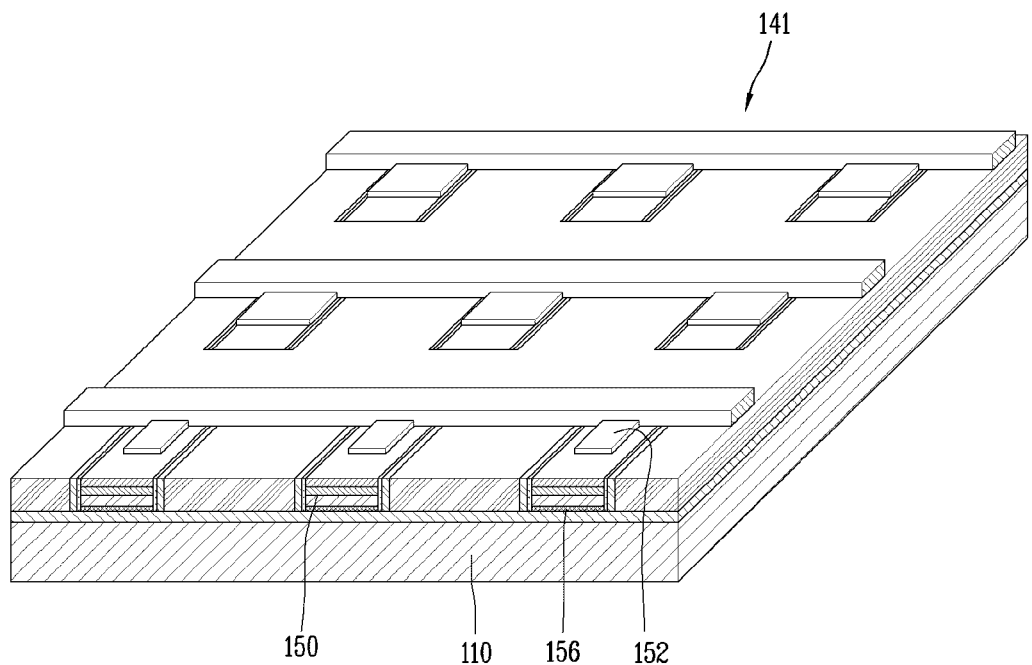

【FIG. 3】
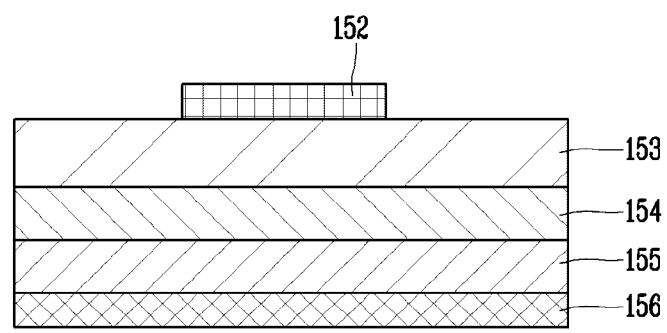
【FIG. 4】
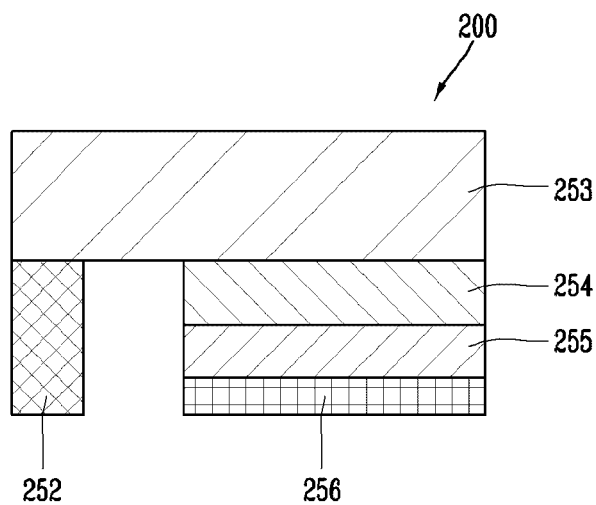

[FIG. 5a]
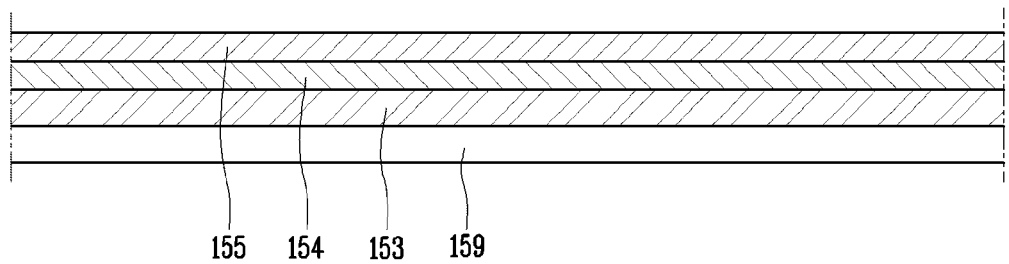
[FIG. 5b]
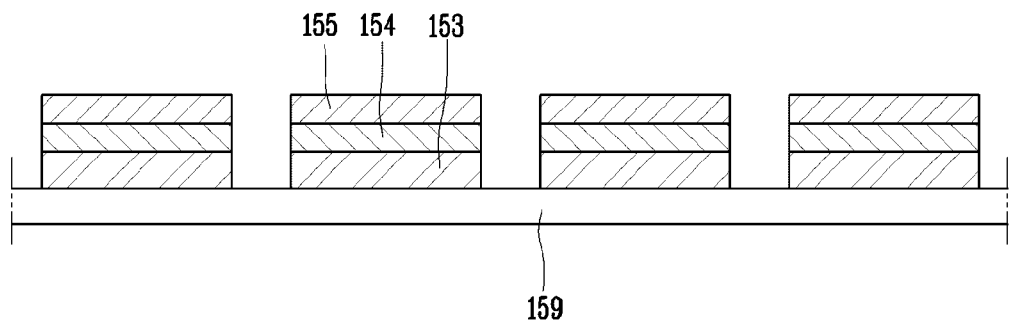
[FIG. 5c]
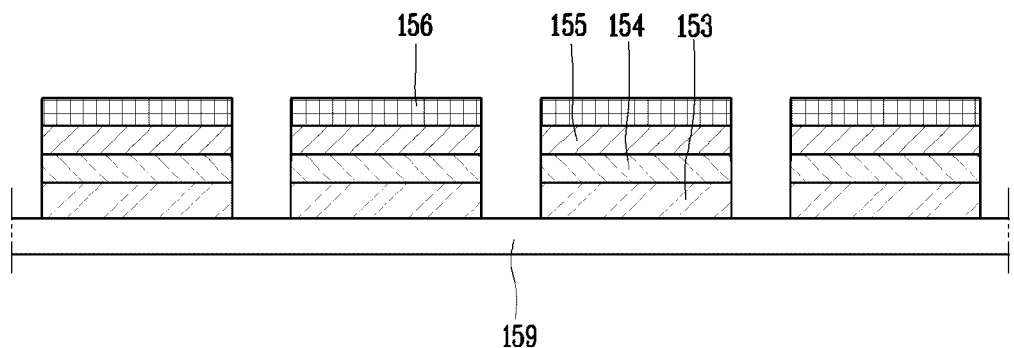

[FIG. 5d]
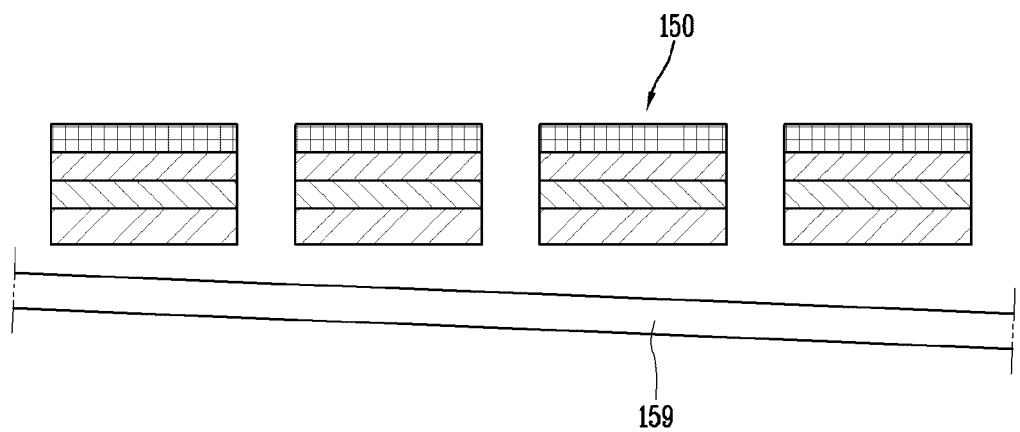
[FIG. 5e]
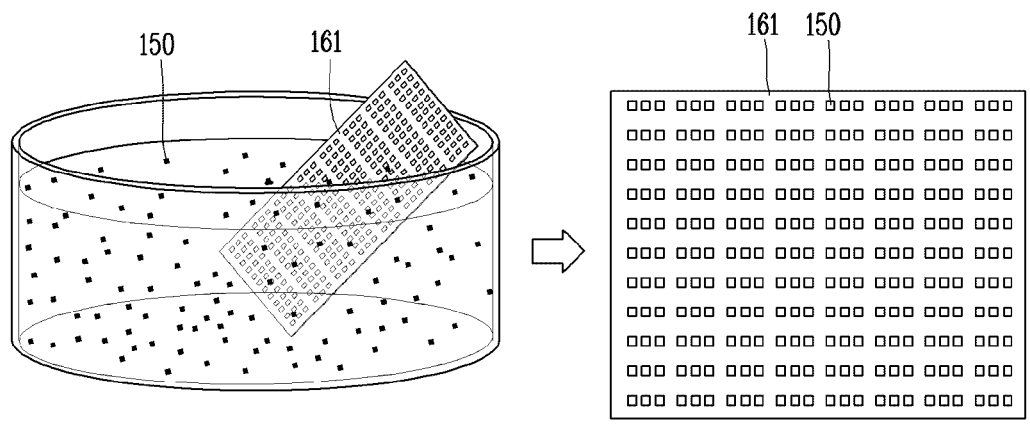

[FIG. 6]
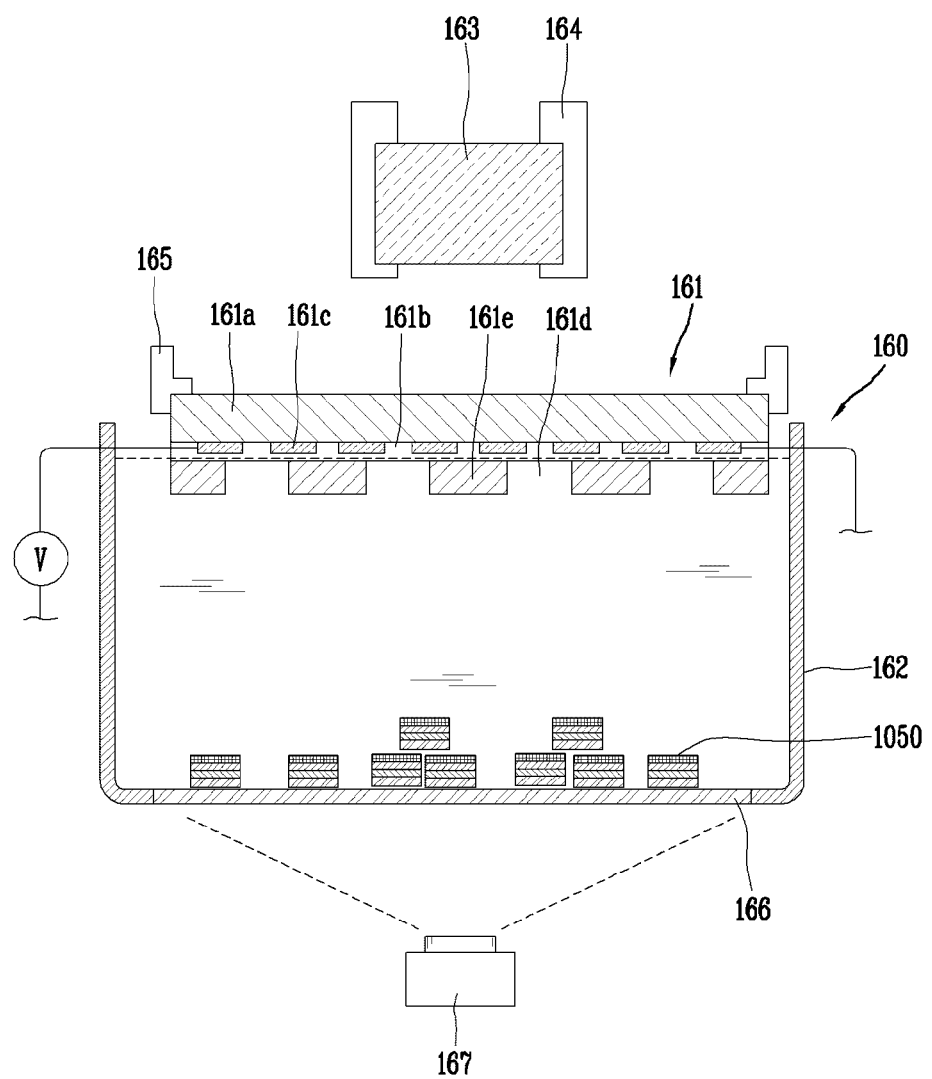

[FIG. 7]
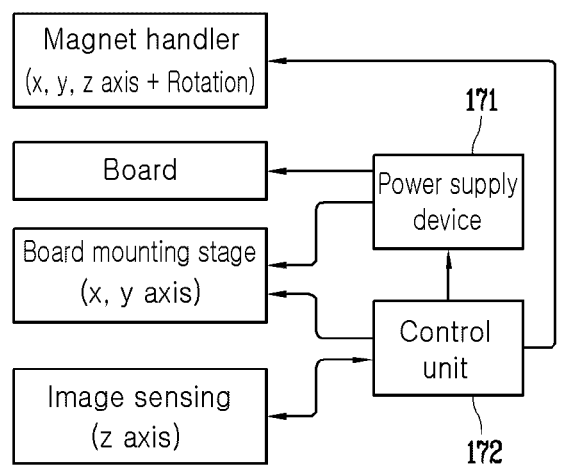

【FIG. 8a】
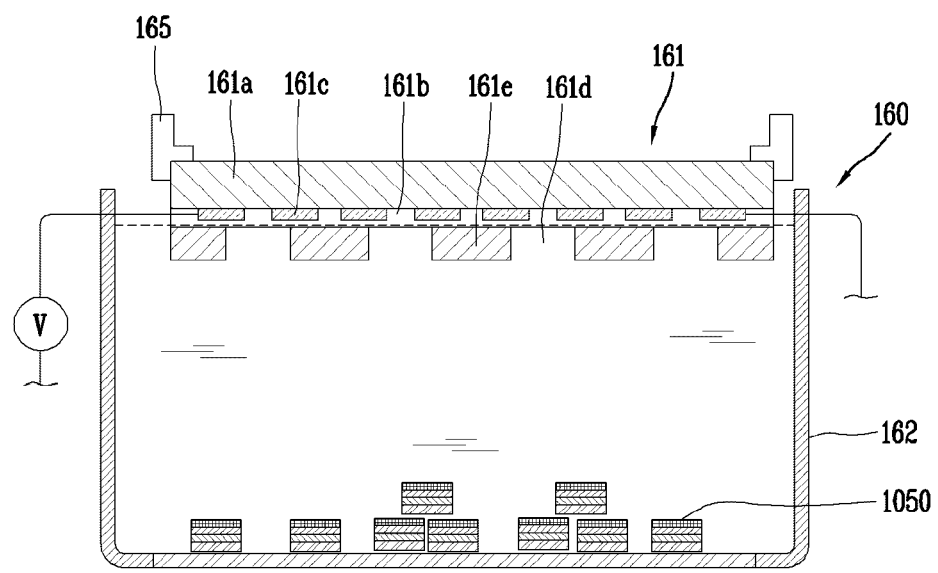

【FIG. 8b】
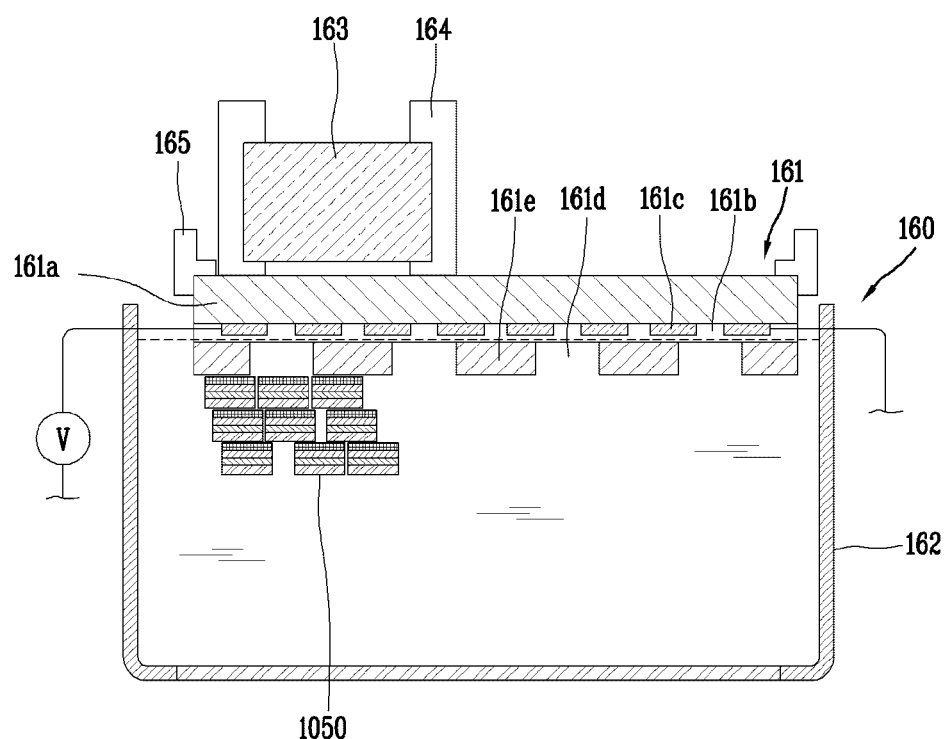

[FIG. 8c]
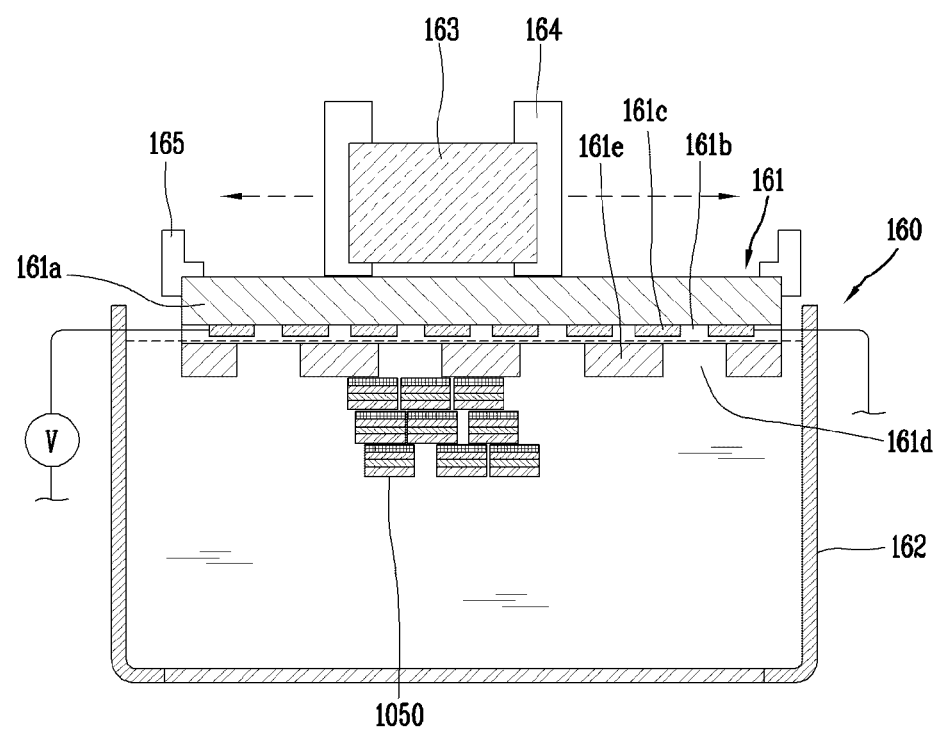

【FIG. 8d】
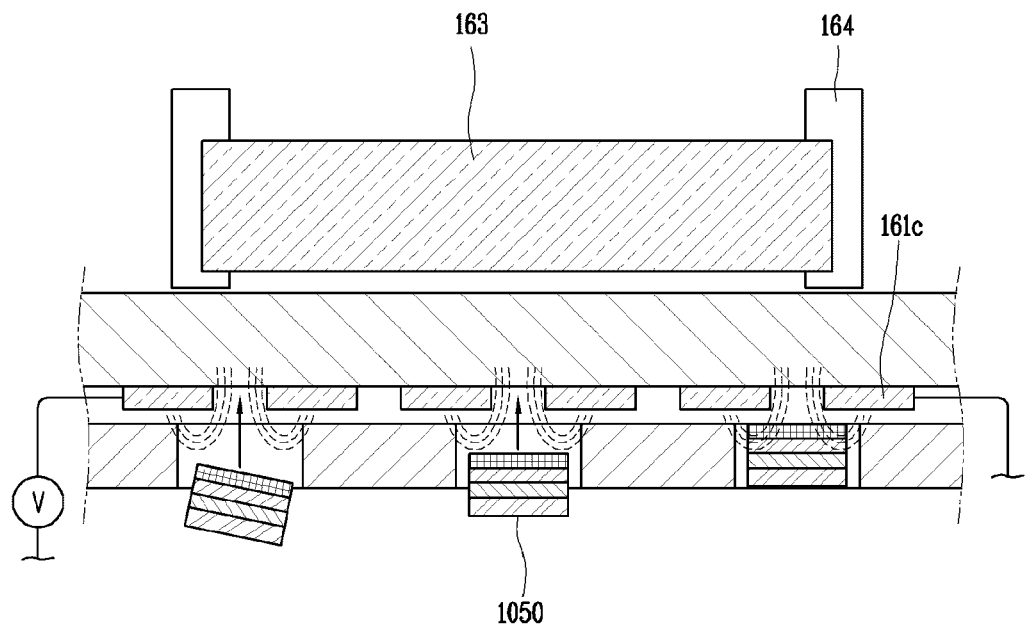
【FIG. 8e】
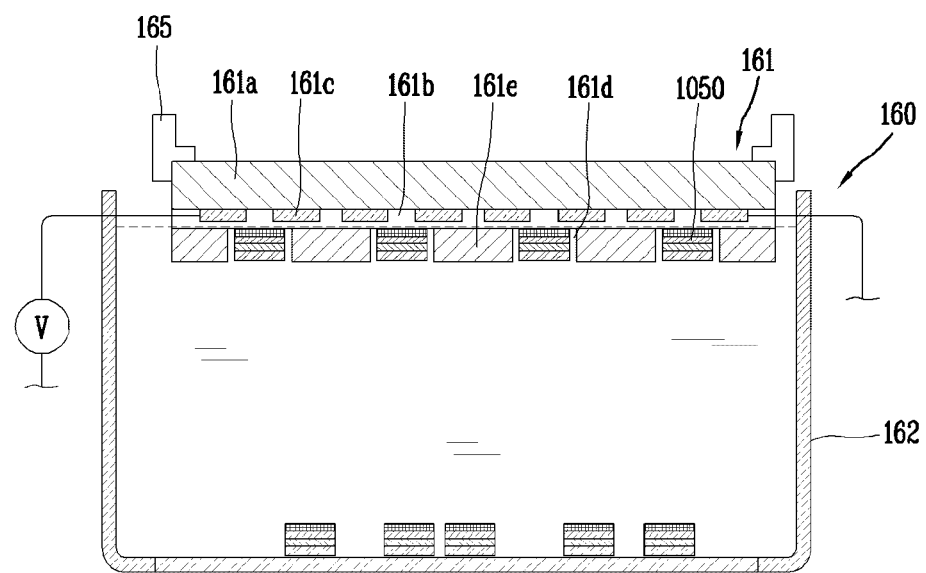

[FIG. 9]
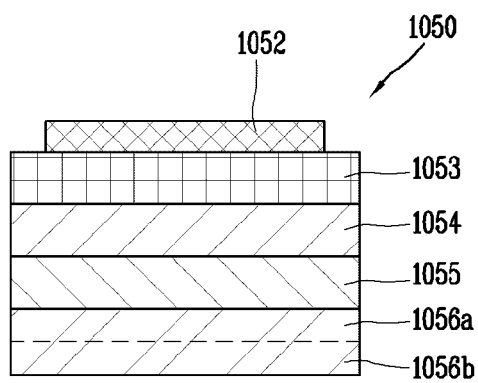

[FIG. 10a]
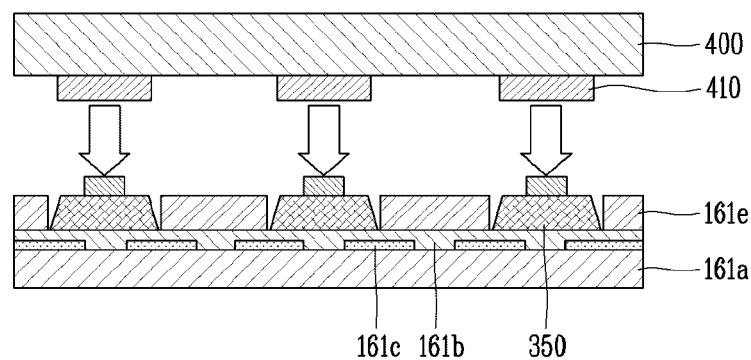
[FIG. 10b]
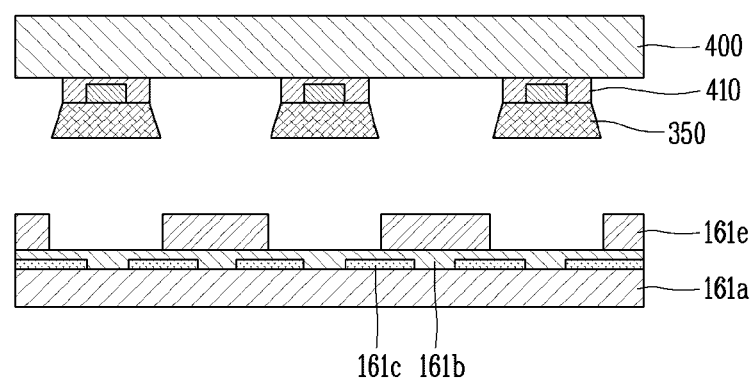

【FIG. 10c】
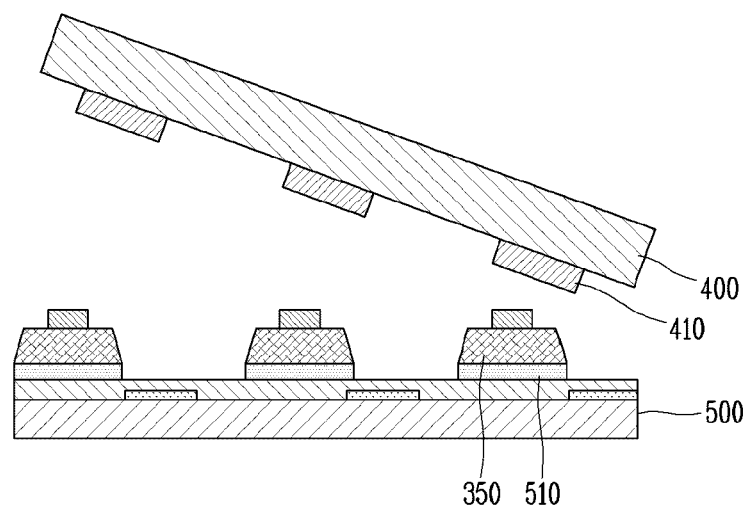

[FIG. 11]
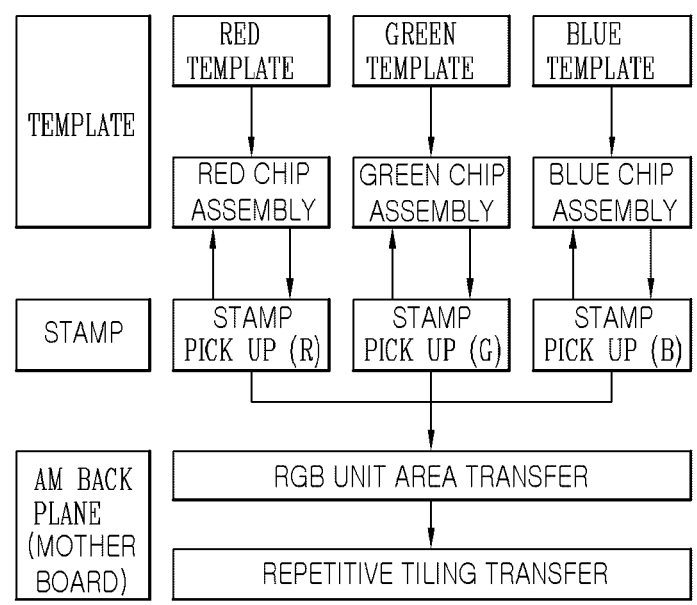

[FIG. 12]
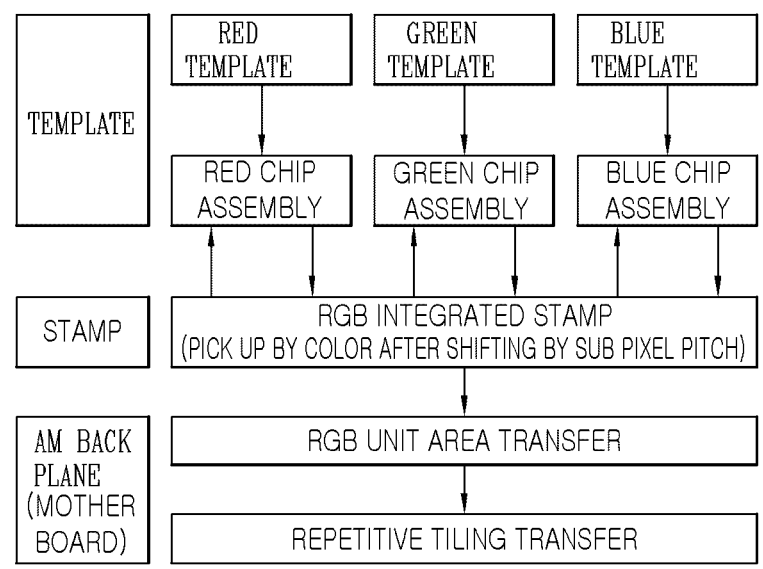

[FIG. 13]
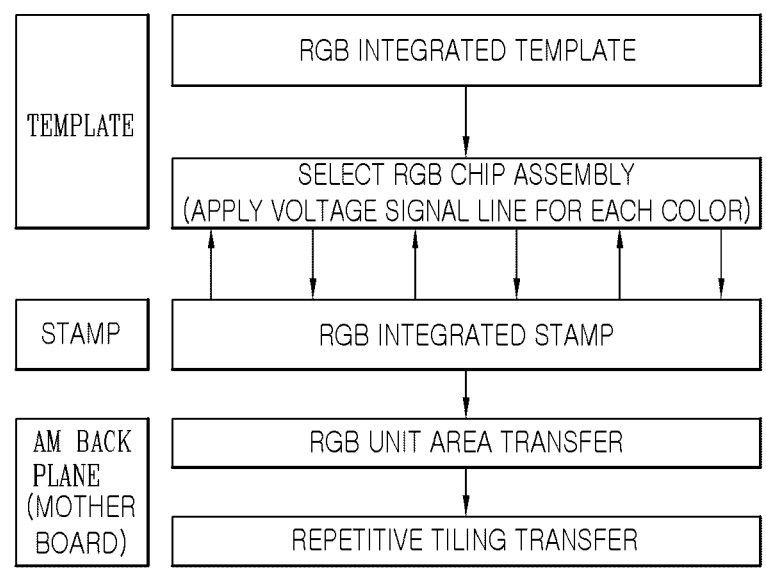

【FIG. 14】
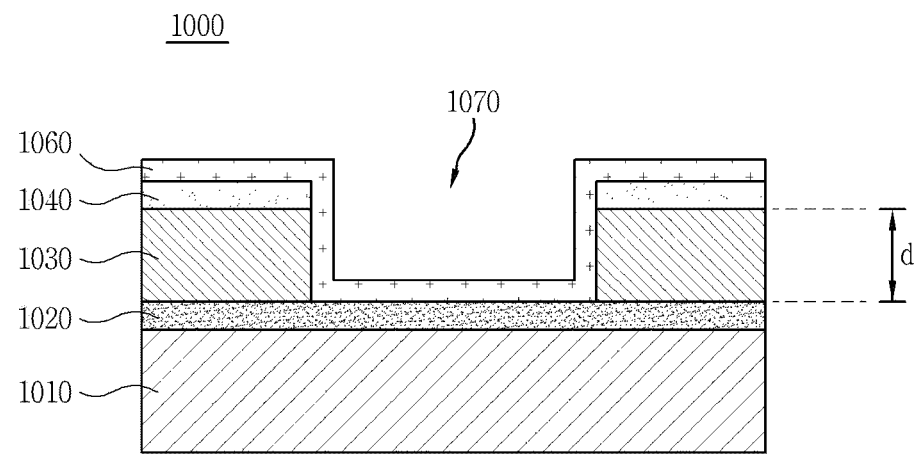
【FIG. 15】
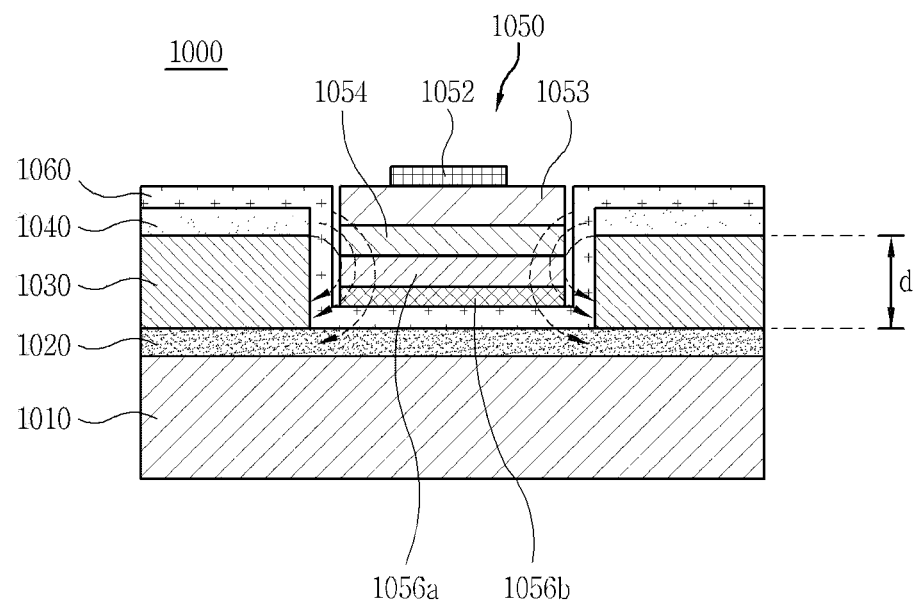

[FIG. 16]
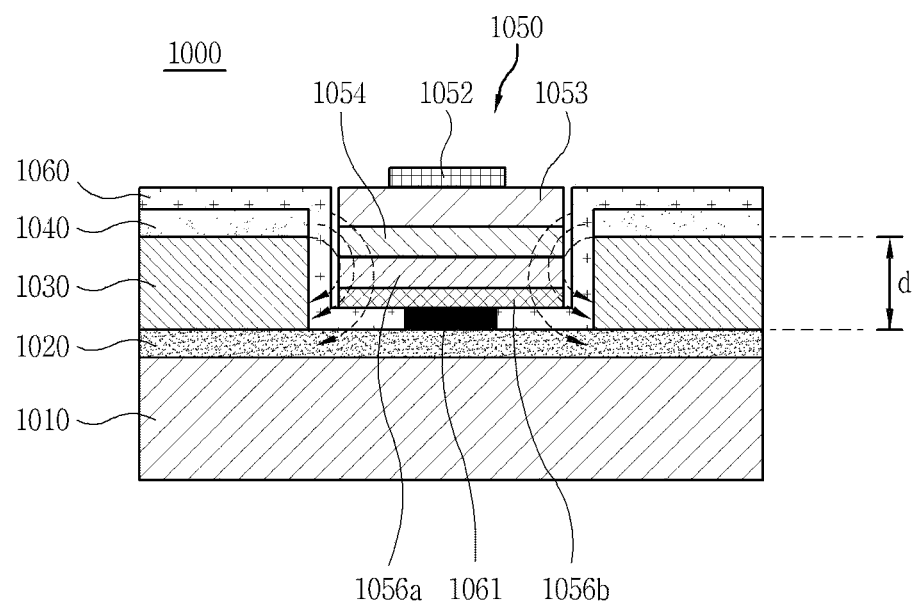
[FIG. 17a]
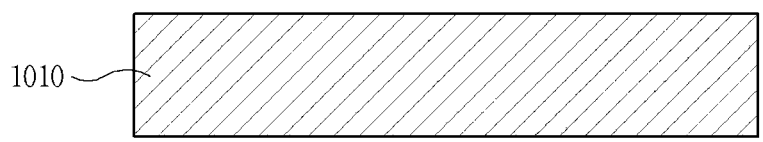
[FIG. 17b]
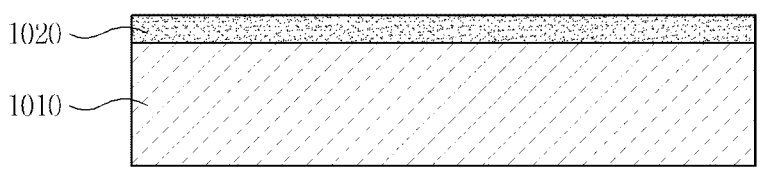

[FIG. 17c]
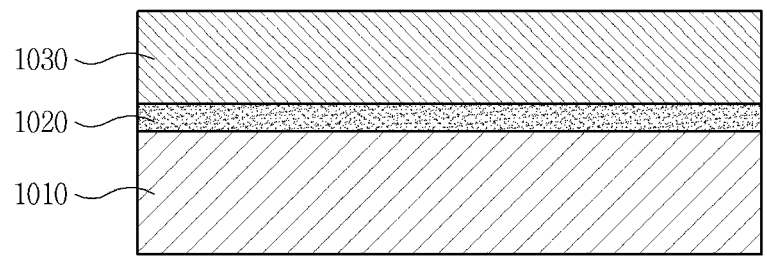
[FIG. 17d]
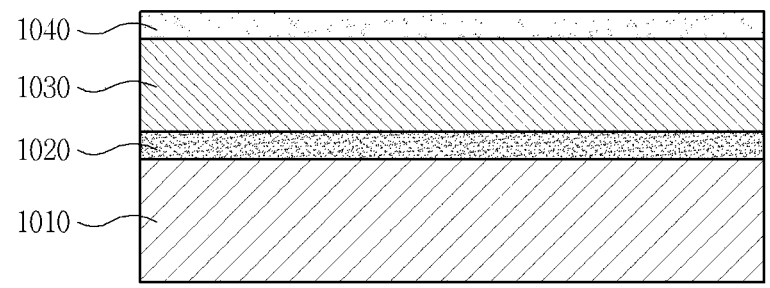
[FIG. 17e]
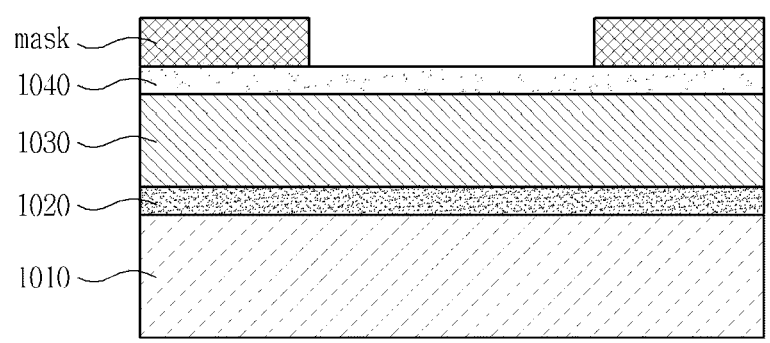

[FIG. 17f]
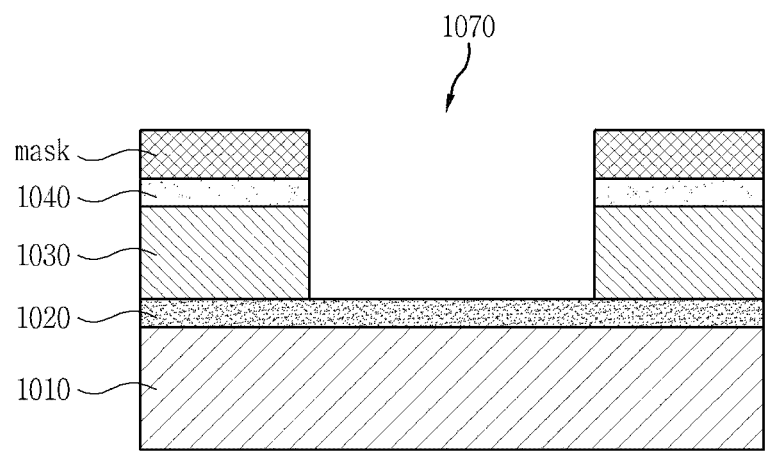
[FIG. 17g]
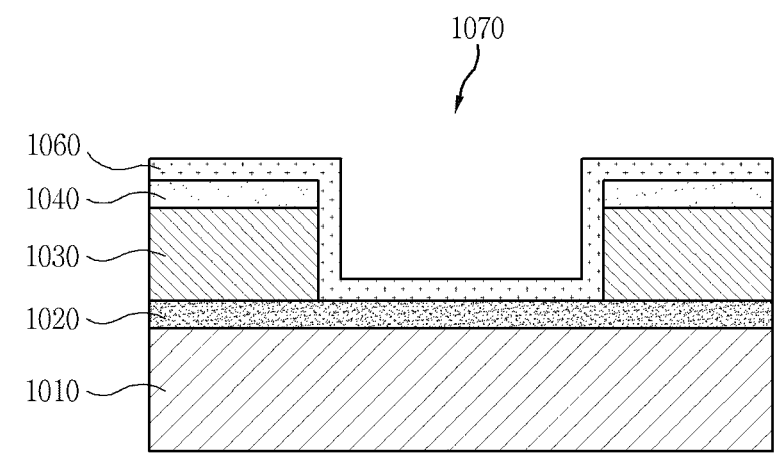

DISPLAY DEVICE USING SEMICONDUCTOR LIGHT-EMITTING ELEMENT SEATED IN PLURALITY OF CELLS OF BARRIER RIB PORTION

CROSS REFERENCE TO RELATED APPLICATIONS

This application is the National Stage filing under 35 U.S.C. 371 of International Application No. PCT/KR2019/017954, filed on Dec. 18, 2019, which claims the benefit of earlier filing date and right of priority to Korean Application No. 10-2019-0164885, filed on Dec. 11, 2019, the entire contents of all these applications are hereby expressly incorporated by reference into the present application.

TECHNICAL FIELD

The present disclosure relates to a display device using a semiconductor light emitting diode and a method for manufacturing the same, and in particular, to a display device using a semiconductor light emitting diode having a size of several to several tens of µm and a method for manufacturing the same.

BACKGROUND ART

Recently, liquid crystal displays (LCD), organic light-emitting diode (OLED) displays, and micro LED displays are competing to implement a large-area display in the field of display technology.

However, in the case of LCD, there are problems such as non-fast response time and low efficiency of light generated by a backlight, and in the case of OLED, there is a weakness in that the lifespan is short, the mass production yield is not good, and the efficiency is low.

On the other hand, if a semiconductor light emitting diode (micro LED) having a cross-sectional area or diameter of 100 µm or less is used in the display, the display does not absorb light using a polarizing plate or the like, and thus, very high efficiency can be provided. However, since a large display requires millions of semiconductor light emitting diodes, it is difficult to transfer the elements, compared to other technologies.

Examples of a technology that is currently being developed as a transfer process include pick & place, laser lift-off (LLO), or self-assembly. Among them, the self-assembly is a method in which a semiconductor light emitting diode finds its own position in a fluid, and is the most advantageous method for realizing a large-screen display device.

On the other hand, the self-assembly includes a method of directly assembling a semiconductor light emitting diode on a final substrate to be used in a product, and a method of assembling a semiconductor light emitting diode on an assembly substrate and then transferring the semiconductor light emitting diode to a final substrate through an additional transfer process. The method of directly assembling on the final substrate is efficient in terms of process. The use of the assembly substrate has an advantage in that a structure for self-assembly can be added without limitation. Therefore, the two methods are selectively used.

DISCLOSURE OF INVENTION

Technical Problem

An object of the present disclosure is to provide a display device for assembly of a miniaturized semiconductor light emitting diode, for example, a semiconductor light emitting diode having a size of 30 µm or less, and a method for manufacturing the same.

Another object of the present disclosure is to provide a display device capable of preventing leakage of an electric field to minimize misassembly of a semiconductor light emitting diode and preparing for the formation of foreign materials, and a method for manufacturing the same.

In addition, another object of the present disclosure is to provide a display device having a structure that is easy to manufacture.

Technical Solution

A display device according to an embodiment of the present disclosure includes: a base portion; first electrode formed on the base portion; a barrier rib portion stacked on the first electrode while forming a plurality of cells; a second electrode formed on the barrier rib portion; and semiconductor light emitting diodes seated in the cells, wherein the first electrode and the second electrode are spaced apart from each other with the barrier rib portion disposed therebetween.

In the present embodiment, the second electrode is formed on a region of the barrier rib portion overlapping at least the first electrode among entire regions of the barrier rib portion.

In the present embodiment, the first electrode extends in a first direction and a second direction crossing the first direction to cover the base portion.

In the present embodiment, the first electrode is a light-transmitting electrode.

In the present embodiment, the second electrode extends in a first direction and a second direction crossing the first direction to cover one surface of the barrier rib portion.

In the present embodiment, the display device further includes a dielectric layer covering the second electrode and extending to an inner surface of the cell to cover the first electrode overlapping the cell.

In the present embodiment, a thickness of the barrier rib portion is 15 µm or less.

In the present embodiment, the semiconductor light emitting diode includes: a first conductivity type electrode; a first conductivity type semiconductor layer formed on the first conductivity type electrode; an active layer formed on the first conductivity type semiconductor layer; a second conductivity type semiconductor layer formed on the active layer; and a second conductivity type electrode formed on the second conductivity type semiconductor layer, wherein at least the first electrode is electrically connected to one of the first conductivity type electrode and the second conductivity type electrode.

A method for manufacturing a display device according to an embodiment of the present disclosure includes: (a) putting a plurality of semiconductor light emitting diodes including a magnetic material into a chamber containing a fluid; (b) disposing a substrate including a first electrode and a second electrode spaced apart from each other with a barrier rib portion disposed therebetween so as to be immersed in the fluid; (c) applying a magnetic force to the semiconductor light emitting diodes put into the chamber containing the fluid so as to move in one direction; and (d) forming an electric field by applying a voltage to the first electrode and the second electrode such that the semiconductor light emitting diodes are seated at a preset position on the assembly substrate while the semiconductor light emitting diodes are moving, wherein the second electrode includes a plurality of lines extending in a first direction and disposed at predetermined intervals.

In the present embodiment, the step (d) includes applying an AC voltage to the first electrode and the second electrode.

In the present embodiment, a thickness of the barrier rib portion is 15 μm or less.

Advantageous Effects

According to an embodiment of the present disclosure, a first electrode and a second electrode, to which a voltage is applied for forming an electric field, are disposed vertically, so that a gap between the first electrode and the second electrode can be narrowed to several to several tens of μm, and further to several tens to hundreds of nm. Therefore, it is possible to form a stronger electric field, compared to the related art. Furthermore, there is an effect that a semiconductor light emitting diode having a size of 30 μm or less can be assembled.

In addition, an electrode disposed on the upper portion can serve to form an electric field and shield the formed electric field from leaking to the outside. Accordingly, there is an effect of preventing the semiconductor light emitting diode from being misassembled at a position other than a cell and preventing the formation of foreign materials.

In addition, when the first electrode and/or the second electrode is formed as a plane electrode, a manufacturing process can be simplified and manufacturing cost can be reduced.

BRIEF DESCRIPTION OF DRAWINGS

FIG. 1 is a conceptual diagram illustrating an embodiment of a display device using a semiconductor light emitting element of the present disclosure.

FIG. 2 is a partially enlarged view of portion A of the display device of FIG. 1.

FIG. 3 is an enlarged view of the semiconductor light emitting element of FIG. 2.

FIG. 4 is an enlarged view illustrating another embodiment of the semiconductor light emitting element of FIG. 2.

FIGS. 5a to 5e are conceptual views for describing a new process of manufacturing the semiconductor light emitting element.

FIG. 6 is a conceptual diagram illustrating an example of a self-assembly apparatus of a semiconductor light emitting element according to the present disclosure.

FIG. 7 is a block diagram of the self-assembly apparatus of FIG. 6.

FIGS. 8a to 8e are conceptual views illustrating a process of self-assembling a semiconductor light emitting element using the self-assembly apparatus of FIG. 6.

FIG. 9 is a conceptual diagram for describing the semiconductor light emitting element of FIGS. 8a to 8e.

FIGS. 10a to 10c are conceptual views illustrating a state in which a semiconductor light emitting element is transferred after a self-assembly process according to the present disclosure.

FIGS. 11 to 13 are flowcharts illustrating a method of manufacturing a display device including semiconductor light emitting elements that emit red (R) light, green (G) light, and blue (B) light.

FIG. 14 is a cross-sectional view of a display device according to an embodiment of the present disclosure.

FIG. 15 is a diagram illustrating a state in which an electric field is formed in a display device according to an embodiment of the present disclosure.

FIG. 16 is a cross-sectional view illustrating a structure in which a semiconductor light emitting diode and a first electrode are electrically connected to each other in a display device according to an embodiment of the present disclosure.

FIGS. 17a to 17g are diagrams illustrating a process of manufacturing a display device according to an embodiment of the present disclosure.

BEST MODE FOR CARRYING OUT THE INVENTION

Hereinafter, the embodiments disclosed herein will be described in detail with reference to the accompanying drawings, and the same or similar elements are designated with the same numeral references regardless of the numerals in the drawings and their redundant description will be omitted. The suffixes "module" and "unit or portion" for components used in the following description are merely provided only for facilitation of preparing this specification, and thus they are not granted a specific meaning or function. In addition, when it is determined that the detailed description of the related known technology may obscure the gist of embodiments disclosed herein in describing the embodiments, a detailed description thereof will be omitted. Further, it should be noted that the accompanying drawings are only for easy understanding of the embodiments disclosed in the present specification, and should not be construed as limiting the technical spirit disclosed in the present specification by the accompanying drawings. It is also understood that when an element, such as a layer, region, or substrate, it is referred to as being "on" another element, it may be directly present on the other element or intervening elements in between.

The display device described herein may include mobile phones, smart phones, laptop computers, digital broadcasting terminals, personal digital assistants (PDA), portable multimedia players (PMP), navigation systems, slate PCs, a Tablet PC, Ultra Books, digital TVs, digital signages, head mounted displays (HMDs), desktop computers, and the like. However, it will be readily apparent to those skilled in the art that the configuration according to the embodiments described in the present specification may be applied to a device capable of display having even a new product form to be developed later.

FIG. 1 is a conceptual diagram illustrating an embodiment of a display device using a semiconductor light emitting element of the present disclosure, FIG. 2 is a partially enlarged view of portion A of the display device of FIG. 1, FIG. 3 is an enlarged view of the semiconductor light emitting element of FIG. 2, and FIG. 4 is an enlarged view illustrating another embodiment of the semiconductor light emitting element of FIG. 2.

As illustrated, information processed by a controller of a display device 100 may be output from a display module 140. A closed-loop-type case 101 surrounding edges of the display module may form a bezel of the display device.

The display module 140 may include a panel 141 on which images are displayed, and the panel 141 may include a micro-sized semiconductor light emitting element 150 and a wiring board 110 on which the semiconductor light emitting element 150 is mounted.

Wirings may be formed on the wiring board 110 to be connected to an n-type electrode 152 and a p-type electrode 156 of the semiconductor light emitting element 150.

Through this, the semiconductor light emitting element 150 may be provided on the wiring board 110 as an individual pixel that emits light itself.

An image displayed on the panel 141 is visual information, and is implemented by independently controlling light emission of sub-pixels arranged in a matrix form through the wirings.

In the present disclosure, a micro LED (Light Emitting Diode) is exemplified as a type of the semiconductor light emitting element 150 that converts current into light. The micro LED may be a light emitting element formed in a small size of 100 micro or less. In the semiconductor light emitting element 150, blue, red, and green colors are provided in light emitting regions, respectively, and a unit pixel may be realized by a combination thereof. That is, the unit pixel may mean a minimum unit for realizing one color, and at least three micro LEDs may be provided in the unit pixel.

More specifically, referring to FIG. 3, the semiconductor light emitting element 150 may have a vertical structure.

For example, the semiconductor light emitting element 150 is mainly made of gallium nitride (GaN), and indium (In) and/or aluminum (Al) are added together to implement a high output light emitting element that emits various lights including blue.

The vertical semiconductor light emitting element may include a p-type electrode 156, a p-type semiconductor layer 155 formed on the p-type electrode 156, an active layer 154 formed on the p-type semiconductor layer 155, an n-type semiconductor layer 153 formed on the active layer 154, and an n-type electrode 152 formed on the n-type semiconductor layer 153. In this case, the p-type electrode 156 positioned in a lower portion may be electrically connected to the p-electrode of the wiring board, and the n-type electrode 152 positioned in an upper portion may be electrically connected to the n-electrode at the upper side of the semiconductor light emitting element. The vertical semiconductor light emitting element 150 has a great advantage in that it is possible to reduce the chip size because electrodes are arranged up and down.

As another example, referring to FIG. 4, the semiconductor light emitting element may be a flip chip type light emitting element.

For this example, the semiconductor light emitting element 250 may include a p-type electrode 256, a p-type semiconductor layer 255 on which the p-type electrode 256 is formed, an active layer 254 formed on the p-type semiconductor layer 255, an n-type semiconductor layer 253 formed on the active layer 254, and an n-type electrode 252 spaced apart from the p-type electrode 256 in the horizontal direction on the n-type semiconductor layer 253. In this case, both the p-type electrode 256 and the n-type electrode 152 may be electrically connected to the p-electrode and n-electrode of the wiring board under the semiconductor light emitting element.

The vertical semiconductor light emitting element and the horizontal semiconductor light emitting element may be a green semiconductor light emitting element, a blue semiconductor light emitting element, or a red semiconductor light emitting element, respectively. In the case of the green semiconductor light emitting element and the blue semiconductor light emitting element, gallium nitride (GaN) is mainly used, and indium (In) and/or aluminum (Al) are added together to implement a high output light emitting element that emits green or blue light. For this example, the semiconductor light emitting element may be a gallium nitride thin film formed in various layers such as n-Gan, p-Gan, AlGaN, InGan, etc. Specifically, the p-type semiconductor layer may be P-type GaN, and the n-type semiconductor layer may be N-type GaN. However, in the case of the red semiconductor light emitting element, the p-type semiconductor layer may be P-type GaAs, and the n-type semiconductor layer may be N-type GaAs.

In addition, the p-type semiconductor layer may be P-type GaN doped with Mg on the p-electrode side, and the n-type semiconductor layer may be N-type GaN doped with Si on the n-electrode side. In this case, the above-described semiconductor light emitting elements may be semiconductor light emitting elements having no active layer.

Meanwhile, referring to FIGS. 1 to 4, since the light emitting elements are very small, unit pixels that emit light themselves may be arranged in a high definition in the display panel, thereby realizing a high-definition display device.

In the display device using the semiconductor light emitting element of the present disclosure described above, the semiconductor light emitting element grown on a wafer and formed through mesa and isolation is used as an individual pixel. In this case, the micro-sized semiconductor light emitting element 150 needs to be transferred to the wafer at a predetermined position on a substrate of the display panel. There is a pick and place technique such as a transfer technique, but the success rate is low and a lot of time is required. As another example, there is a technique of transferring several devices at a time using a stamp or a roll, but it is not suitable for a large screen display due to a limitation in yield. The present disclosure proposes a new manufacturing method and manufacturing apparatus for a display device that can solve these problems.

To this end, a new method of manufacturing a display device will be described below. FIGS. 5a to 5e are conceptual views for describing a new process of manufacturing the semiconductor light emitting element.

In the present specification, a display device using a passive matrix (PM) type semiconductor light emitting element is taken as an example. However, the examples described below are also applicable to an active matrix (AM) type semiconductor light emitting element. In addition, although a method of self-assembling a horizontal semiconductor light emitting element is described as an example, it is also applicable to a method of self-assembling a vertical semiconductor light emitting element.

First, according to the manufacturing method, a first conductivity type semiconductor layer 153, an active layer 154, and a second conductivity type semiconductor layer 155 are individually grown on a growth substrate 159 (FIG. 5A).

After the first conductivity type semiconductor layer 153 is grown, the active layer 154 is grown on the first conductivity type semiconductor layer 153, and then the second conductivity type semiconductor layer 155 is grown on the active layer 154. In this way, when the first conductivity type semiconductor layer 153, the active layer 154, and the second conductivity type semiconductor layer 155 are sequentially grown, as shown in FIG. 5A, the first conductivity type semiconductor layer 153, the active layer 154 and the second conductive semiconductor layer 155 form a stacked structure.

In this case, the first conductivity type semiconductor layer 153 may be a p-type semiconductor layer, and the second conductivity type semiconductor layer 155 may be an n-type semiconductor layer. However, the present disclosure is not necessarily limited thereto, and the first conductivity type may be n-type and the second conductivity type may be p-type.

In addition, although the present embodiment exemplifies the case in which the active layer is present, a structure in which the active layer is not present is also possible in some cases as described above. As an example, the p-type semiconductor layer may be P-type GaN doped with Mg, and the n-type semiconductor layer may be N-type GaN doped with Si on the n-electrode side.

The growth substrate 159 (wafer) may be formed of a material having a light-transmitting property, for example, any one of sapphire (Al2O3), GaN, ZnO, and AlO, but is not limited thereto. In addition, the growth substrate 159 may be formed of a material suitable for semiconductor material growth, a carrier wafer. The growth substrate 159 may be formed of a material having excellent thermal conductivity, and may include a conductive board or an insulating board, for example, a SiC board having higher thermal conductivity than a sapphire (Al2O3) board, or use at least one of Si, GaAs, GaP, InP, and Ga2O3.

Next, at least a portion of the first conductivity type semiconductor layer 153, the active layer 154, and the second conductivity type semiconductor layer 155 are removed to form a plurality of semiconductor light emitting elements (FIG. 5b).

More specifically, isolation is performed such that the plurality of light emitting elements form a light emitting element array. That is, the first conductivity type semiconductor layer 153, the active layer 154, and the second conductivity type semiconductor layer 155 are vertically etched to form a plurality of semiconductor light emitting elements.

In the case of forming a horizontal type semiconductor light emitting element, a mesa process in which the active layer 154 and the second conductivity type semiconductor layer 155 are partially removed in the vertical direction and the first conductivity type semiconductor layer 153 is exposed to the outside and thereafter, isolation in which the first conductivity type semiconductor layer is etched to form a plurality of semiconductor light emitting element arrays may be performed.

Next, second conductivity type electrodes 156 (or p-type electrodes) are formed on one surface of the second conductivity type semiconductor layer 155 (FIG. 5c). The second conductive electrode 156 may be formed by a deposition method such as sputtering, but the present disclosure is not limited thereto. However, when the first conductive semiconductor layer and the second conductive semiconductor layer are an n-type semiconductor layer and a p-type semiconductor layer, respectively, the second conductivity type electrode 156 may be an n-type electrode.

Then, the growth substrate 159 is removed to provide a plurality of semiconductor light emitting elements. For example, the growth substrate 159 may be removed using a laser lift-off (LLO) method or a chemical lift-off (CLO) method (FIG. 5d).

Thereafter, the semiconductor light emitting elements 150 are seated on a board in a chamber filled with a fluid (FIG. 5e).

For example, the semiconductor light emitting elements 150 and the board are put in the chamber filled with a fluid, and the semiconductor light emitting elements are self-assembled onto the board 161 using flow, gravity, surface tension, and the like. In this case, the board may be an assembled board 161.

As another example, it is also possible to put the wiring board in a fluid chamber instead of the assembly board 161 so that the semiconductor light emitting elements 150 are directly seated on the wiring board. In this case, the board may be a wiring board. However, for convenience of description, in the present disclosure, the board is provided as, for example, the assembly board 161 on which the semiconductor light emitting elements 1050 are seated.

Cells (not shown) in which the semiconductor light emitting elements 150 are inserted may be provided in the assembly board 161 to facilitate mounting of the semiconductor light emitting elements 150 on the assembly board 161. Specifically, cells in which the semiconductor light emitting elements 150 are seated are formed in the assembly board 161 at positions where the semiconductor light emitting elements 150 are to be aligned with wiring electrodes. The semiconductor light emitting elements 150 are assembled to the cells while moving in the fluid.

After a plurality of semiconductor light emitting elements are arrayed on the assembly board 161, the semiconductor light emitting elements of the assembly board 161 are transferred to a wiring board, enabling large-area transfer. Accordingly, the assembly board 161 may be referred to as a temporary board.

On the other hand, in order to apply the self-assembly method described above to the manufacture of a large-screen display, it is necessary to increase transfer yield. The present disclosure proposes a method and apparatus for minimizing the influence of gravity or frictional force and preventing non-specific binding in order to increase the transfer yield.

In this case, in the display device according to the present disclosure, a magnetic material is disposed on the semiconductor light emitting element to move the semiconductor light emitting element using magnetic force, and the semiconductor light emitting element is seated at a predetermined position by using an electric field during movement. Hereinafter, the transfer method and apparatus will be described in more detail with the accompanying drawings.

FIG. 6 is a conceptual diagram illustrating an example of a self-assembly apparatus of a semiconductor light emitting element according to the present disclosure, and FIG. 7 is a block diagram of the self-assembly apparatus of FIG. 6. FIGS. 8A to 8E are conceptual views illustrating a process of self-assembling a semiconductor light emitting element using the self-assembly apparatus of FIG. 6, and FIG. 9 is a conceptual diagram for describing the semiconductor light emitting element of FIGS. 8A to 8E.

Referring to FIGS. 6 and 7, a self-assembly apparatus 160 of the present disclosure may include a fluid chamber 162, a magnet 163 and a position control unit 164.

The fluid chamber 162 has a space for accommodating a plurality of semiconductor light emitting elements. The space may be filled with a fluid, and the fluid may include water or the like as an assembly solution. Accordingly, the fluid chamber 162 may be a water tank and may be configured in an open type. However, the present disclosure is not limited thereto, and the fluid chamber 162 may be of a closed type in which the space is a closed space.

The board 161 may be disposed in the fluid chamber 162 such that an assembly surface on which the semiconductor light emitting elements 150 are assembled faces downward. For example, the board 161 may be transferred to an assembly position by a transfer device, and the transfer device may include a stage 165 on which the board is mounted. The position of the stage 165 is controlled by the control unit, and through this, the board 161 may be transferred to the assembly position.

In this case, in the assembly position, the assembly surface of the board 161 faces the bottom of the fluid chamber 150. As shown, the assembly surface of the board 161 is disposed to be immersed in the fluid in the fluid chamber 162. Accordingly, the semiconductor light emitting element 150 moves to the assembly surface in the fluid.

The board 161 is an assembly board in which an electric field is able to be formed, and may include a base portion 161a, a dielectric layer 161b, and a plurality of electrodes 161c.

The base portion 161a may be formed of an insulating material, and the plurality of electrodes 161c may be a thin or thick bi-planar electrode patterned on one surface of the base portion 161a. The electrode 161c may be formed of, for example, a stack of Ti/Cu/Ti, Ag paste, and ITO.

The dielectric layer 161b may be formed of an inorganic material such as $SiO_2$, $SiN_x$, $SiON$, $Al_2O_3$, $TiO_2$, $HfO_2$, or the like. Alternatively, the dielectric layer 161b may be comprised of a single layer or a multi-layer as an organic insulator. The dielectric layer 161b may have a thickness of several tens of nm to several µm.

Furthermore, the board 161 according to the present disclosure includes a plurality of cells 161d separated by barrier ribs. The cells 161d are sequentially arranged in one direction and may be made of a polymer material. Also, the barrier ribs 161e defining the cells 161d are shared with the neighboring cells 161d. The barrier ribs 161e may protrude from the base portion 161a, and the cells 161d may be sequentially arranged along one direction by the barrier ribs 161e. More specifically, the cells 161d are sequentially arranged in the column and row directions, respectively, and may have a matrix structure.

As shown, the cell 161d may have a groove for accommodating the semiconductor light emitting element 150 and the groove may be a space defined by the barrier ribs 161e. The shape of the groove may be the same as or similar to that of the semiconductor light emitting element. For example, when the semiconductor light emitting element has a rectangular shape, the groove may have a rectangular shape. Also, although not shown, when the semiconductor light emitting element has a circular shape, the groove formed in the cells may have a circular shape. Furthermore, each of the cells is configured to accommodate a single semiconductor light emitting element. That is, one semiconductor light emitting element is accommodated in one cell.

Meanwhile, the plurality of electrodes 161c may include a plurality of electrode lines disposed at the bottom of each of the cells 161d, and the plurality of electrode lines may extend to adjacent cells.

The plurality of electrodes 161c are disposed below the cells 161d, and different polarities are applied to the electrodes 161c to generate an electric field in the cells 161d. To form the electric field, the dielectric layer may form the bottom of the cells 161d while the dielectric layer is covering the plurality of electrodes 161c. In this structure, when different polarities are applied to the pair of electrodes 161c under the cells 161d, an electric field is formed, and the semiconductor light emitting elements may be inserted into the cells 161d due to the electric field.

In the assembly position, the electrodes of the board 161 are electrically connected to a power supply device 171. The power supply device 171 may apply power to the plurality of electrodes to generate the electric field.

As shown, the self-assembly apparatus may include a magnet 163 for applying a magnetic force to the semiconductor light emitting elements. The magnet 163 is spaced apart from the fluid chamber 162 to apply a magnetic force to the semiconductor light emitting elements 150. The magnet 163 may be disposed to face the opposite surface of the assembly surface of the board 161, and the position of the magnet is controlled by the position control unit 164 connected to the magnet 163.

The semiconductor light emitting element 1050 may include a magnetic material to move in the fluid due to the magnetic field of the magnet 163.

Referring to FIG. 9, a semiconductor light emitting element including a magnetic material may include a first conductivity type electrode 1052, a second conductivity type electrode 1056, a first conductivity type semiconductor layer 1053 on which the first conductivity type electrode 1052 is disposed, a second conductivity type semiconductor layer 1055 on which the second conductivity type electrode 1056 is disposed, the second conductivity type semiconductor layer 1055 overlapping the first conductivity type semiconductor layer 1052 and an active layer 1054 disposed between the first and second conductivity type semiconductor layers 1053 and 1055.

Here, the first conductivity type may be p-type, the second conductivity type may be n-type, and vice versa. In addition, as described above, the semiconductor light emitting element having no active layer may be used.

Meanwhile, in the present disclosure, the first conductivity type electrode 1052 may be generated after the semiconductor light emitting element is assembled to the wiring board through self-assembly of the semiconductor light emitting element. Also, in the present disclosure, the second conductivity type electrode 1056 may include the magnetic material. The magnetic material may mean a magnetic metal. The magnetic material may be Ni, SmCo, or the like, and as another example, may include a material corresponding to at least one of Gd-based, La-based, and Mn-based materials.

The magnetic material may be provided in the second conductivity type electrode 1056 in the form of particles. Alternatively, the conductivity type electrode including a magnetic material may have one layer formed of a magnetic material. For this example, as shown in FIG. 9, the second conductivity type electrode 1056 of the semiconductor light emitting element 1050 may include a first layer 1056a and a second layer 1056b. Here, the first layer 1056a may include a magnetic material, and the second layer 1056b may include a metal material rather than a magnetic material.

As shown, in this example, the first layer 1056a including a magnetic material may be disposed to contact the second conductivity type semiconductor layer 1055. In this case, the first layer 1056a is disposed between the second layer 1056b and the second conductivity type semiconductor layer 1055. The second layer 1056b may be a contact metal connected to the second electrode of the wiring board. However, the present disclosure is not necessarily limited thereto, and the magnetic material may be disposed on one surface of the first conductivity type semiconductor layer.

Referring back to FIGS. 6 and 7, more specifically, the self-assembly apparatus is provided with a magnet handler that is movable automatically or manually in the x, y, and z axes on the upper portion of the fluid chamber, or a motor capable of rotating the magnet 163. The magnet handler and the motor may constitute the position control unit 164. Through this, the magnet 163 may rotate in a horizontal direction with the board 161, clockwise or counterclockwise direction.

Meanwhile, a bottom plate 166 having a light-transmitting property may be formed in the fluid chamber 162, and the semiconductor light emitting elements may be disposed between the bottom plate 166 and the board 161. An image sensor 167 may be disposed to face the bottom plate 166 to monitor the inside of the fluid chamber 162 through the bottom plate 166. The image sensor 167 is controlled by the control unit 172 and may include an inverted type lens, a CCD and the like to observe the assembly surface of the board 161.

The self-assembly apparatus described above is configured to use a combination of a magnetic field and an electric field, and when using this, the semiconductor light emitting elements may be seated at predetermined positions on the board due to an electric field while moving by a change in the position of the magnet. Hereinafter, an assembly process using the self-assembly apparatus described above will be described in more detail.

First, a plurality of semiconductor light emitting elements 1050 including a magnetic material are formed through the process described with reference to FIGS. 5A to 5C. In this case, in the process of forming the second conductivity type electrode of FIG. 5C, a magnetic material may be deposited on the semiconductor light emitting element.

Next, the board 161 is transferred to an assembly position, and the semiconductor light emitting elements 1050 are put into the fluid chamber 162 (FIG. 8a).

As described above, the assembly position of the board 161 may be a position in which the board 161 is to be disposed in the fluid chamber 162 such that the assembly surface of the board 161 on which the semiconductor light emitting elements 1050 are to be assembled faces downward.

In this case, some of the semiconductor light emitting elements 1050 may sink to the bottom of the fluid chamber 162 and some may float in the fluid. The bottom plate 166 having a light-transmitting property is provided in the fluid chamber 162, and some of the semiconductor light emitting elements 1050 may sink to the bottom plate 166.

Next, a magnetic force is applied to the semiconductor light emitting elements 1050 such that the semiconductor light emitting elements 1050 vertically float in the fluid chamber 162 (FIG. 8b)

When the magnet 163 of the self-assembly apparatus moves from its original position to the opposite surface of the assembly surface of the board 161, the semiconductor light emitting elements 1050 may float toward the board 161 in the fluid. The original position may be a position deviated from the fluid chamber 162. As another example, the magnet 163 may be made of an electromagnet. In this case, electricity is supplied to the electromagnet to generate an initial magnetic force.

Meanwhile, in this example, when the magnitude of the magnetic force is adjusted, the separation distance between the assembly surface of the board 161 and the semiconductor light emitting elements 1050 may be controlled. For example, the separation distance is controlled using the weight, buoyancy, and magnetic force of the semiconductor light emitting elements 1050. The separation distance may be several millimeters to several tens of micrometers from the outermost edge of the board.

Next, a magnetic force is applied to the semiconductor light emitting elements 1050 such that the semiconductor light emitting elements 1050 move in one direction in the fluid chamber 162. For example, it is possible to move the magnet 163 in a direction horizontal to the board, clockwise or counterclockwise (FIG. 8c). In this case, the semiconductor light emitting elements 1050 move in a direction parallel to the board 161 from positions spaced apart from the board 161 due to the magnetic force.

Next, an electric field is applied to guide the semiconductor light emitting elements 1050 to preset positions such that the semiconductor light emitting elements 1050 are seated in the preset positions of the board 161 while the semiconductor light emitting elements 1050 are moving (FIG. 8c). For example, while the semiconductor light emitting elements 1050 are moving in a direction horizontal to the board 161, the semiconductor light emitting elements 1050 may move in a direction perpendicular to the board 161 due to the electric field, and be then seated in the preset positions of the board 161.

More specifically, an electric field is generated by supplying power to the bi-planar electrode of the board 161 to enable assembly to be made only at preset positions. That is, the semiconductor light emitting elements 1050 are self-assembled at assembly positions of the board 161 by using the selectively generated electric field. To this end, cells in which the semiconductor light emitting elements 1050 are inserted may be provided in the board 161.

Thereafter, a process of unloading the board 161 is performed, and the assembly process is finished. When the board 161 is an assembly board, a post-process for realizing a display device by transferring the semiconductor light emitting elements arranged as described above to a wiring board may be performed.

Meanwhile, after guiding the semiconductor light emitting elements 1050 to the preset positions, the magnet 163 may be moved in a direction away from the board 161 such that the semiconductor light emitting elements 1050 remaining in the fluid chamber 162 fall to the bottom of the fluid chamber 162 (FIG. 8d). As another example, when power supply is stopped in a case where the magnet 163 is an electromagnet, the semiconductor light emitting elements 1050 remaining in the fluid chamber 162 may fall to the bottom of the fluid chamber 162.

Thereafter, when the semiconductor light emitting elements 1050 at the bottom of the fluid chamber 162 are recovered, the recovered semiconductor light emitting elements 1050 may be reused.

The self-assembly apparatus and method described above may use a magnetic field to enable distant parts to congregate near a predetermined assembly site and apply a separate electric field to the assembly site such that the parts are selectively assembled only to the assembly site in order to increase the assembly yield in fluidic assembly. In this case, the assembly board is placed on the upper portion of the water tank and the assembly surface is directed downward to minimize the effect of gravity due to the weight of the parts and prevent non-specific binding to eliminate defects. That is, to increase the transfer yield, the assembly board is placed on the upper portion to minimize the effect of gravity or frictional force, and to prevent non-specific binding.

As described above, according to the present disclosure having the above configuration, in a display device in which individual pixels are formed of semiconductor light emitting elements, a large number of semiconductor light emitting elements may be assembled at once.

As described above, according to the present disclosure, it is possible to pixelate a large amount of semiconductor light emitting elements on a small-sized wafer and then transfer the semiconductor light emitting elements to a large-area substrate. Through this, it is possible to manufacture a large-area display device at a low cost.

Hereinafter, a display device using a semiconductor light emitting diode having a novel structure according to an embodiment of the present disclosure and a method for manufacturing the same will be described with reference to the accompanying drawings.

The display device described below may be used as an assembly substrate and a final substrate. In addition, when the display device described below is a final substrate, the display device is applicable to both a passive matrix (PM) display device and an active matrix (AM) display device.

According to the display device and the manufacturing method therefor according to the present disclosure, a miniaturized semiconductor light emitting diode, for example, a semiconductor light emitting diode having a size of 30 μm or less, may be assembled by self-assembly using an electric field and a magnetic field.

FIG. 14 is a cross-sectional view of a display device according to an embodiment of the present disclosure, and FIG. 15 is a diagram illustrating a state in which an electric field is formed in a display device according to an embodiment of the present disclosure.

According to an embodiment of the present disclosure, a display device 1000 may include a base portion 1010, a first electrode 1020, a barrier rib portion 1030, a second electrode 1040, a semiconductor light emitting diode 1050, and a dielectric layer 1060.

The base portion 1010 may be made of a transparent material or an opaque material. In addition, the base portion 1010 may be made of a material including glass and polyimide (PI) in order to implement a flexible display device, and any insulating and flexible material may be used.

The first electrode 1020 may be formed on the base portion 1010. The first electrode 1020 may be a bar-shaped or plane-shaped electrode patterned on one surface of the base portion 1010. That is, the first electrode 1020 may extend in at least a first direction. In addition, the first electrode 1020 may include a single-layer or multi-layer metal thin film, a metal paste, or a transparent electrode such as indium tin oxide (ITO), indium zinc oxide (IZO), or $In_2O_3$.

The barrier rib portion 1030 may be stacked on all of part of one surface of the first electrode 1020. The barrier rib portion 1030 may be stacked on the first electrode 1020 while forming cells 1070 at predetermined intervals in one direction to overlap the first electrode 1020. In addition, the barrier rib portion 1030 may be made of an organic insulating material or an inorganic insulating material such as $SiO_2$, $SiN_x$, $Al_2O_3$, $TiO_2$, or $HfO_2$.

The second electrode 1040 may be disposed on the barrier rib portion 1030. Specifically, the second electrode 1040 may be made of at least one metal material selected from Al, Cu, Mo, Cr, and Ag, and may be a bar-shaped electrode patterned on one surface of the barrier rib portion 1030 or a plane-shaped electrode deposited on one surface of the barrier rib portion 1030. That is, the second electrode 1040 may extend in at least the first direction. When the second electrode 1040 has a bar shape, the second electrode 1040 may include a plurality of electrode lines. The plurality of electrode lines may form a pair of pair electrodes between lines arranged adjacent to each other.

In addition, the second electrode 1040 may be formed on a partial region of the barrier rib portion 1030 overlapping the first electrode 1020 among the entire regions of the barrier rib portion 1030. That is, the second electrode 1040 may not be formed on the region of the barrier rib portion 1030 that does not overlap the first electrode 1020.

The dielectric layer 1060 may be formed on the second electrode 1040. In detail, the dielectric layer 1060 may be formed to extend from one surface of the second electrode 1040 to the inner surface of the cell 1070 to cover the first electrode 1020 overlapping the cell 1070. For example, the dielectric layer 1060 may be made of an inorganic insulating material such as $SiO_2$, $SiN_x$, $Al_2O_3$, $TiO_2$, or $HfO_2$.

On the other hand, the semiconductor light emitting diode 1050 may be seated in the cell 1070. For example, the semiconductor light emitting diode 1050 may be a horizontal or vertical semiconductor light emitting diode including a magnetic material, and may have a symmetrical structure for self-assembly. Preferably, the semiconductor light emitting diode 1050 seated in the cell 1070 may be a vertical semiconductor light emitting diode illustrated in FIG. 9.

The vertical semiconductor light emitting diode may include a first conductivity type electrode 1056b, a first conductivity type semiconductor layer 1055 formed on the first conductivity type electrode 1056b, an active layer 1054 formed on the first conductivity type semiconductor layer 1055, a second conductivity type semiconductor layer 1053 formed on the active layer 1054, and a second conductivity type electrode 1052 formed on the second conductivity type semiconductor layer 1053. In the vertical semiconductor light emitting diode, the first conductivity type electrode 1056b and the second conductivity type electrode 1052 may be disposed on different surfaces. Therefore, the semiconductor light emitting diode 1050 may have a structure advantageous for miniaturization.

According to an embodiment of the present disclosure, a voltage for forming an electric field may be applied to the first electrode 1020 and the second electrode 1040. That is, the display device 1000 according to an embodiment of the present disclosure may have a structure including the first electrode 1020 and the second electrode 1040 as electrodes for forming an electric field.

In the display device 1000 according to an embodiment of the present disclosure, the first electrode 1020 and the second electrode 1040 may be spaced apart from each other with the barrier rib portion 1030 disposed therebetween (spaced apart in the stacking direction based on the drawing).

A distance between the first electrode 1020 and the second electrode 1040 may be determined by a thickness d of the barrier rib portion 1030. The thickness d of the barrier rib portion 1030 may be several to several tens of μm, and further, several tens to hundreds of nm.

According to an embodiment of the present disclosure, the thickness d of the barrier rib portion 1030 may be equal to or less than the minimum distance between adjacent assembled electrodes in which the first electrode 1020 and the second electrode 1040 are conventionally disposed in a horizontal direction.

Preferably, the thickness d of the barrier rib portion 1030 may be 15 μm or less, and further, several μm or several tens to hundreds of nm.

That is, according to an embodiment of the present disclosure, the gap between the first electrode 1020 and the second electrode 1040 spaced apart from each other in the stacking direction may be determined by adjusting the deposition thickness of the barrier rib portion 1030, without depending on a patterning method through a conventional photolithography process. It is easy to narrow the gap between the first electrode 1020 and the second electrode 1040, thereby increasing strength of an electric field for assembling the semiconductor light emitting diode 1050.

Accordingly, the display device 1000 according to the embodiment of the present disclosure has an advantageous effect in assembling the miniaturized semiconductor light emitting diode 1050, for example, a semiconductor light emitting diode 1050 having a size of 30 μm or less.

On the other hand, an AC voltage may be applied to the first electrode 1020 and the second electrode 1040.

$$\vec{F}_{DEP} = 2\pi\varepsilon_1 \, \text{Re}|K(\omega)|r^3 \nabla E_{rms}^2 \qquad \text{[Equation 1]}$$

Referring to Equation 1, since the strength of the electric field decreases as a radius r of the semiconductor light emitting diode 1050 decreases, the strength of the electric field may be compensated by applying an AC voltage. For example, when the AC voltage is applied, a difference in voltages applied to the first electrode 1020 and the second electrode 1040 may be increased, thereby increasing the strength of the electric field.

Hereinafter, embodiments of the first electrode 1020 and the second electrode 1040 will be described.

For example, the first electrode 1020 formed on the base portion 1010 may extend in at least the first direction. Preferably, the first electrode 1020 may be formed in a plane shape extending in the first direction and a second direction crossing the first direction to cover the base portion 1010.

In this case, the first electrode 1020 may be a metal electrode or a light-transmitting transparent electrode described above. With such a plane structure, the first electrode 1020 may be formed on the base portion 1010 through a sputtering process, a spraying process, or the like, instead of a photolithography process. Therefore, there is an advantage in terms of simplifying the manufacturing process and reducing manufacturing costs.

In addition, the second electrode 1040 formed on the barrier rib portion 1030 may extend in at least the first direction. Preferably, the second electrode 1040 may be formed in a plane shape extending in the first direction and the second direction crossing the first direction to cover one surface of the barrier rib portion 1030.

That is, according to an embodiment of the present disclosure, the first electrode 1020 and the second electrode 1040 may be formed as plane-shaped electrodes without a separate patterning process through photolithography. When the first electrode 1020 and/or the second electrode 1040 are formed as a plane electrode, a manufacturing process can be simplified and manufacturing cost can be reduced.

According to the structure of the display device 1000 according to the embodiment of the present disclosure, as illustrated in FIG. 15, the electric field may be formed in the height direction (or vertical direction) of the cell 1070. In order to form the vertical electric field, a voltage may be simultaneously applied to the first electrode 1020 and the second electrode 1040. In this case, an electric field may be formed inside the cell 1070 by applying voltages of different polarities to the first electrode 1020 and the second electrode 1040.

On the other hand, in the embodiment of the present disclosure, the second electrode 1040 may serve to shield the electric field. Accordingly, it is possible to prevent the surface of the dielectric layer 1060 from being charged, and it is possible to prepare for a phenomenon in which the semiconductor light emitting diode 1050 is misassembled in a region other than the cell 1070.

In addition, when the strength of the electric field is increased, the electric field forming region may be contaminated by foreign materials including carbon. However, the second electrode 1040 may prevent the formation of foreign materials by shielding the leaking electric field.

FIG. 16 is a cross-sectional view illustrating a structure in which a semiconductor light emitting diode and a first electrode are electrically connected to each other in a display device according to an embodiment of the present disclosure.

Referring to FIG. 16. the semiconductor light emitting diode 1050 seated in the cell 1070 may be electrically connected to the first electrode 1020. That is, the first electrode 1020 may be used as an assembly electrode for self-assembly of the semiconductor light emitting diode 1050, and may also serve as a wiring electrode to be electrically connected to the semiconductor light emitting diode 1050.

For example, as illustrated in FIG. 16, the first electrode 1020 and the first conductivity type electrode 1056b of the semiconductor light emitting diode 1050 may be electrically connected to each other. To this end, the dielectric layer 1060 extending to the bottom surface of the cell 1070 may include a solder portion 1061. The solder portion 1061 may be formed by filling a conductive material such as a metal, but the present disclosure is not limited thereto.

Although not illustrated in the drawing, a structure in which the second electrode 1040 and the second conductivity type electrode 1052 of the semiconductor light emitting diode 1050 are electrically connected to each other is also possible.

Hereinafter, a method for manufacturing a display device according to an embodiment of the present disclosure will be described.

The method for manufacturing the display device according to the embodiment of the present disclosure may be a self-assembly method using an electric field and a magnetic field, and may be performed in a fluid.

Prior to self-assembly, a process of manufacturing the display device 1000 having the above-described structure will be described with reference to FIGS. 17a to 17g.

FIGS. 17a to 17g are diagrams illustrating a process of manufacturing a display device according to an embodiment of the present disclosure.

First, a step of forming a first electrode 1020 on a base portion 1010 may be performed. The base portion 1010 may be made of an insulating and flexible material. For example, the base portion 1010 may be a transparent glass substrate.

The first electrode 1020 may be an assembled electrode for forming an electric field during self-assembly, and may optionally be used as a wiring electrode. The first electrode 1020 may be made of a conductive metal material, and may be formed to cover the base portion 1010 through sputtering. In an embodiment, the first electrode 1020 may be indium tin oxide (ITO). In addition, the first electrode 1020 may be formed to a thickness of several tens to several hundreds of nm. The method for forming the first electrode 1020 is not limited thereto.

Next, a step of sequentially forming a barrier rib portion 1030 and a second electrode 1040 on the first electrode 1020 may be performed. For example, the barrier rib portion 1030 may be made of an organic insulating material or an inorganic insulating material, and the second electrode 1040 may be made of a metal material.

Next, a step of coating a photoresist (PR) on the second electrode 1040 and selectively exposing the PR to form a mask may be performed. A region in which the mask is not formed may be etched to form a cell 1070 in which a semiconductor light emitting diode 1050 is seated.

Next, the mask may be removed and a dielectric layer 1060 may be formed. For example, the dielectric layer 1060 may be made of an inorganic insulating material, and may be formed to extend from one surface of the second electrode 1040 to the inner surface of the cell 1070 to cover the first electrode 1020.

Then, a step of seating the semiconductor light emitting diodes 1050 in the cell 1070 described above may be performed, and this step may be performed by a self-assembly method.

For the self-assembly, a step of putting the plurality of semiconductor light emitting diodes 1050 including a magnetic material into a chamber containing a fluid may be performed. The semiconductor light emitting diodes 1050 emitting the same color may be put into the chamber.

Next, a step of disposing the manufactured substrate so as to be immersed in a fluid may be performed. According to an embodiment of the present disclosure, the substrate may be disposed such that the first electrode 1020 and the second electrode 1040 are spaced apart from each other with the barrier rib portion 1030 disposed therebetween. In particular, the first electrode 1020 and the second electrode 1040 may be spaced apart from each other at intervals of about several tens of μm or less with the barrier rib portion 1030 disposed therebetween. Preferably, the barrier rib portion 1030 may have a thickness d of 15 μm or less, and thus, the first electrode 1020 and the second electrode 1040 may have an interval of 15 μm or less.

On the other hand, the substrate may be disposed such that a surface (hereinafter, referred to as an assembly surface) on which the semiconductor light emitting diode 1050 is assembled is immersed in the fluid.

Next, a step of applying a magnetic field so that the semiconductor light emitting diodes 1050 put into the chamber move in one direction may be performed. Specifically, a magnetic force may be applied to the semiconductor light emitting diodes 1050 by using a magnet array disposed on the other side of the assembly surface of the substrate. The assembly surface is a surface on which the semiconductor light emitting diode 1050 is assembled, and may refer to a surface including structures for assembling the semiconductor light emitting diodes 1050, for example, the first electrode 1020 and the second electrode 1040.

Next, a step of forming an electric field for seating the moving semiconductor light emitting diodes 1050 at a preset position on the substrate may be performed. The preset position may refer to the cell 1070.

Specifically, an electric field may be formed by applying a voltage to the first electrode 1020 and the second electrode 1040 so as to be seated on the cell 1070 while the semiconductor light emitting diodes 1050 are moving. Voltages of different polarities may be applied to the first electrode 1020 and the second electrode 1040. Preferably, an AC voltage may be applied to the first electrode 1020 and the second electrode 1040. In addition, the strength of the electric field may be increased by increasing the voltage difference when the AC voltage is applied.

According to an embodiment of the present disclosure, an electric field may be formed in a direction perpendicular to the substrate by applying a voltage to the first electrode 1020 and the second electrode 1040.

As described above, according to an embodiment of the present disclosure, the first electrode 1020 and the second electrode 1040, to which the voltage is applied for forming the electric field, are disposed vertically, so that the gap between the first electrode 1020 and the second electrode 1040 can be narrowed to several to several tens of μm, and further to several tens to hundreds of nm. Therefore, it is possible to form a stronger electric field, compared to the related art. Furthermore, there is an effect that the semiconductor light emitting diode having a size of 30 μm or less can be assembled.

In addition, the electrode disposed on the upper portion can serve to form an electric field and shield the formed electric field from leaking to the outside. Accordingly, there is an effect of preventing the semiconductor light emitting diode 250 from being misassembled at a position other than the cell 1070 and preventing the formation of foreign materials.

In addition, when the first electrode 1020 and/or the second electrode 1040 are formed as a plane electrode, a manufacturing process can be simplified and manufacturing cost can be reduced.

The present disclosure is not limited to the configuration and method of the embodiments described above, and all or part of the embodiments may be selectively combined so that various modifications can be made thereto.

The invention claimed is:

1. A display device comprising:
    a base portion;
    a first electrode formed on the base portion;
    a barrier rib portion stacked on the first electrode while forming a plurality of cells;
    a second electrode formed on the barrier rib portion; and
    semiconductor light emitting diodes seated in the plurality of cells,
    wherein the first electrode and the second electrode are spaced apart from each other with the barrier rib portion disposed therebetween,
    wherein each semiconductor light emitting diode includes:
        a first conductivity type electrode;
        a first conductivity type semiconductor layer formed on the first conductivity type electrode;
        an active layer formed on the first conductivity type semiconductor layer;
        a second conductivity type semiconductor layer formed on the active layer; and
        a second conductivity type electrode formed on the second conductivity type semiconductor layer, and
    wherein at least the first electrode is electrically connected to one of the first conductivity type electrode and the second conductivity type electrode.

2. The display device of claim 1, wherein the second electrode is formed on a region of the barrier rib portion overlapping at least the first electrode among entire regions of the barrier rib portion.

3. The display device of claim 1, wherein the first electrode extends in a first direction and a second direction crossing the first direction to cover the base portion.

4. The display device of claim 1, wherein the first electrode is a light-transmitting electrode.

5. The display device of claim 1, wherein the second electrode extends in a first direction and a second direction crossing the first direction to cover one surface of the barrier rib portion.

6. The display device of claim 1, further comprising a dielectric layer covering the second electrode and extending to an inner surface of a cell among the plurality of cells to cover the first electrode overlapping the cell.

7. The display device of claim 6, wherein the second electrode shields an electric field from charging a surface of the dielectric layer.

8. The display device of claim 1, wherein a thickness of the barrier rib portion is 15 μm or less.

9. The display device of claim 1, wherein the first electrode and the second electrode are separated in a thickness direction of the base portion.

10. The display device of claim 1, wherein the first electrode and the second electrode are separated by at least a thickness of the barrier rib portion.

11. The display device of claim 6, wherein the dielectric layer includes at least one of $SiO_2$, $SiN_x$, $Al_2O_3$, $TiO_2$, or $HfO_2$.

12. A display device comprising:
- a base portion;
- a first electrode disposed on the base portion;
- a barrier rib portion stacked on the first electrode;
- a second electrode disposed on the barrier rib portion;
- a dielectric layer covering the second electrode and extending through the barrier rib portion to contact the first electrode;
- a plurality of cells disposed at locations where the dielectric layer contacts the first electrode; and
- semiconductor light emitting diodes seated in the plurality of cells.

13. The display device of claim 12, wherein the first electrode and the second electrode are spaced apart from each other in a thickness direction of the barrier rib portion.

14. The display device of claim 12, wherein a thickness of the barrier rib portion is 15 μm or less.

* * * * *